United States Patent [19]

Kawamura et al.

[11] Patent Number: 5,628,828
[45] Date of Patent: May 13, 1997

[54] PROCESSING METHOD AND EQUIPMENT FOR PROCESSING A SEMICONDUCTOR DEVICE HAVING HOLDER/CARRIER WITH FLATTENED SURFACE

[75] Inventors: Yoshio Kawamura, Kokubunji; Shigeo Moriyama, Tama; Tatuharu Yamamoto, Higashi-Murayama; Fumihiko Uchida, Hachioji, all of Japan

[73] Assignee: Hitachi, Ltd., Tokyo, Japan

[21] Appl. No.: 397,991

[22] Filed: Mar. 3, 1995

[30] Foreign Application Priority Data

Mar. 4, 1994 [JP] Japan .................. 6-034406

[51] Int. Cl.$^6$ .................................................. C23C 16/00
[52] U.S. Cl. .................. 118/719; 414/217; 414/939; 427/248.1
[58] Field of Search .................. 118/719, 723 E, 118/723 R, 723 MP, 723 MW, 723 I, 723 HC; 414/217, 939; 427/248.1; 156/345

[56] References Cited

U.S. PATENT DOCUMENTS

| | | | |
|---|---|---|---|
| 4,825,806 | 5/1989 | Tawada | 118/719 |
| 4,869,976 | 9/1989 | Tawada | 427/39 |
| 4,951,601 | 8/1990 | Maydan | 118/719 |
| 5,016,562 | 5/1991 | Maydan | 118/719 |
| 5,076,205 | 12/1991 | Vowles | 118/719 |
| 5,088,908 | 2/1992 | Ezaki | 425/73 |
| 5,259,881 | 11/1993 | Edwards | 118/719 |
| 5,286,296 | 2/1994 | Sato | 118/719 |
| 5,288,379 | 2/1994 | Namiki | 204/192.12 |
| 5,292,393 | 3/1994 | Maydan | 156/345 |
| 5,344,542 | 9/1994 | Maher | 204/298.15 |
| 5,486,080 | 1/1996 | Sieradzki | 414/217 |

FOREIGN PATENT DOCUMENTS

| | | | |
|---|---|---|---|
| 88819 | 5/1984 | Japan . | |
| 315594 | 12/1988 | Japan | 118/719 |
| 283618 | 12/1991 | Japan | 118/719 |
| 63414 | 2/1992 | Japan . | |
| 65823 | 3/1992 | Japan . | |

*Primary Examiner*—Richard Bueker
*Assistant Examiner*—Jeffrie R. Lund
*Attorney, Agent, or Firm*—Antonelli, Terry, Stout & Kraus, LLP

[57] ABSTRACT

Process equipment and method for processing a semiconductor device comprising a buffer chamber, at least one process chamber connected to the buffer chamber through an opening portion, a holding/carrying unit disposed at a position facing the opening portion for holding and carrying a member to be processed such as a wafer, and a carrier unit disposed in the buffer chamber for transferring the member to be processed to and from the holding/carrying unit. The holding/carrying unit includes a flattened surface closely facing the opening portion for holding an atmosphere in the at least one process chamber independently from an atmosphere in the buffer chamber. The opening portion has a flattened surface closely facing the flattened surface of the holding/carrying unit.

17 Claims, 6 Drawing Sheets

PROCESSING METHOD AND EQUIPMENT FOR PROCESSING A SEMICONDUCTOR DEVICE HAVING HOLDER/CARRIER WITH FLATTENED SURFACE

BACKGROUND OF THE INVENTION

The present invention relates to process equipment for a semiconductor device, and particularly to process equipment for a semiconductor device in which a plurality of different process chambers are connected to each other, a method of processing a semiconductor device using said process equipment, and a semiconductor device processed by the method.

Through process equipment for a semiconductor device has been proposed, for example in Japanese Pat. Laid-Open No. HEI 4–63414, wherein a plurality of process chambers for carrying out process steps such as cleaning, film formation, etching, and latent-image exposure are connected to each other around a buffer chamber having means for holding/carrying wafers, whereby each wafer can be carried between the process chambers without exposure to the atmospheric air, thus preventing the surface of the wafer from being contaminated and thereby improving the performance of the obtained semiconductor device. On the other hand, as process equipment for a semiconductor device in which a pattern is formed on a local region of the surface of a wafer while the local region is kept under vacuum, Japanese Pat. Laid-Open No. SHO 59-88819 has disclosed process equipment in which a pattern is formed on a local region of the surface of a wafer held in the atmospheric air while the local region is evacuated by a differential exhaust means.

In the above-described through process equipment having a plurality of the process chambers, each process chamber is partitioned from the buffer chamber by way of a gate valve, and for each carrying of a wafer, an atmospheric pressure of each process chamber is adjusted to be almost equal to that of the buffer chamber, after which the gate valve between both the chambers is opened/closed. This equipment, therefore, has a disadvantage that it takes a lot of time to carry a wafer between the process chambers, resulting in the reduced throughput. In the above-described semiconductor process equipment for forming a pattern on a local region of a wafer while keeping the local region under vacuum, there occurs a disadvantage that, since the region already processed is exposed directly after being processed, the surface of the wafer is eventually oxidized, or contaminated by unnecessary atoms and molecules, thereby reducing the yield in the case of producing high quality semiconductor devices.

SUMMARY OF THE INVENTION

An object of the present invention is to provide equipment and a method for processing a semiconductor device, wherein when each wafer to be processed is transferred between a plurality of process chambers having different atmospheric conditions and is sequentially subjected to a plurality of process steps, the wafer is subjected to a specified process in each process chamber by exposing the wafer to a process atmosphere of the process chamber while keeping constant the atmospheric condition of the process chamber, thereby processing semiconductor devices at a high throughput and at a high yield without contamination onto the wafer.

To achieve the above object, according to the present invention, there is provided process equipment for a semiconductor device in which a plurality of process chambers having different atmospheric conditions are integrally connected to one buffer chamber containing a plurality of wafer holding/carrying means, wherein a plurality of the process chambers are opened into an internal space of the buffer chamber by way of opening portions each having a differential exhaust mechanism, and each of the holding/carrying means is disposed so as to be close and face to each of the opening portions for holding the gap between the holding/carrying means and the opening portion to be small, whereby atmospheric conditions of each process chamber and the buffer chamber can be independently held. The above differential exhaust mechanism is provided to surround the opening portion for exhausting an atmospheric gas liable to be leaked passing through the gap around the opening portion by the differential exhaust mechanism.

In processing a semiconductor device using the process equipment for a semiconductor device having the above construction, each wafer to be processed is mounted on each of the holding/carrying means and then fed to a position facing to the opening portion of each process chamber, after which the wafer is subjected to a specified process by exposing it to an atmosphere of each process chamber. The wafer, which is already subjected to a specified process in one process chamber, is then fed to a position facing to the opening portion of the next process chamber, to be thus subjected to the next process. Even in the transfer of the wafer described above, part of the surface of the holding/carrying means is made to be close and face to the opening portion of each process chamber.

With this construction of the equipment of the present invention, by making small the gap between the opening portion of each process chamber and the surface of the wafer holding/carrying means, an exhaust conductance between each process chamber and the buffer chamber can be sufficiently made small, and further since the gap around the opening portion of the process chamber is differentially exhausted, the atmosphere of each process chamber is prevented from being mixed with that of the buffer chamber. Accordingly, a wafer can be subjected to a necessary process by moving it to a position facing to an arbitrary process chamber while independently maintaining perfectly the necessary atmospheric conditions of each process chamber and the buffer chamber.

The buffer chamber can be kept filled with a high purity inert gas atmosphere, so that the surface of a wafer can be prevented from being oxidized or contaminated by foreign elements or molecules when the wafer is moved between the process chambers. Consequently, high quality semiconductor devices can be processed at a high yield.

In sequentially moving a wafer between a plurality of process chambers for applying a series of necessary process steps to the wafer, there can be eliminated the need for resetting of the atmospheric conditions of each process chamber and the buffer chamber. Thus, a wafer can be processed in one process chamber directly after being fed therein, and it can be carried to the next process chamber directly after being processed in the previous process chamber and then processed therein. This enables semiconductor devices to be processed at a high throughput.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Hereinafter, embodiments of the present invention will be described in detail with reference to the drawings.

<Embodiment 1>

Figure 1:
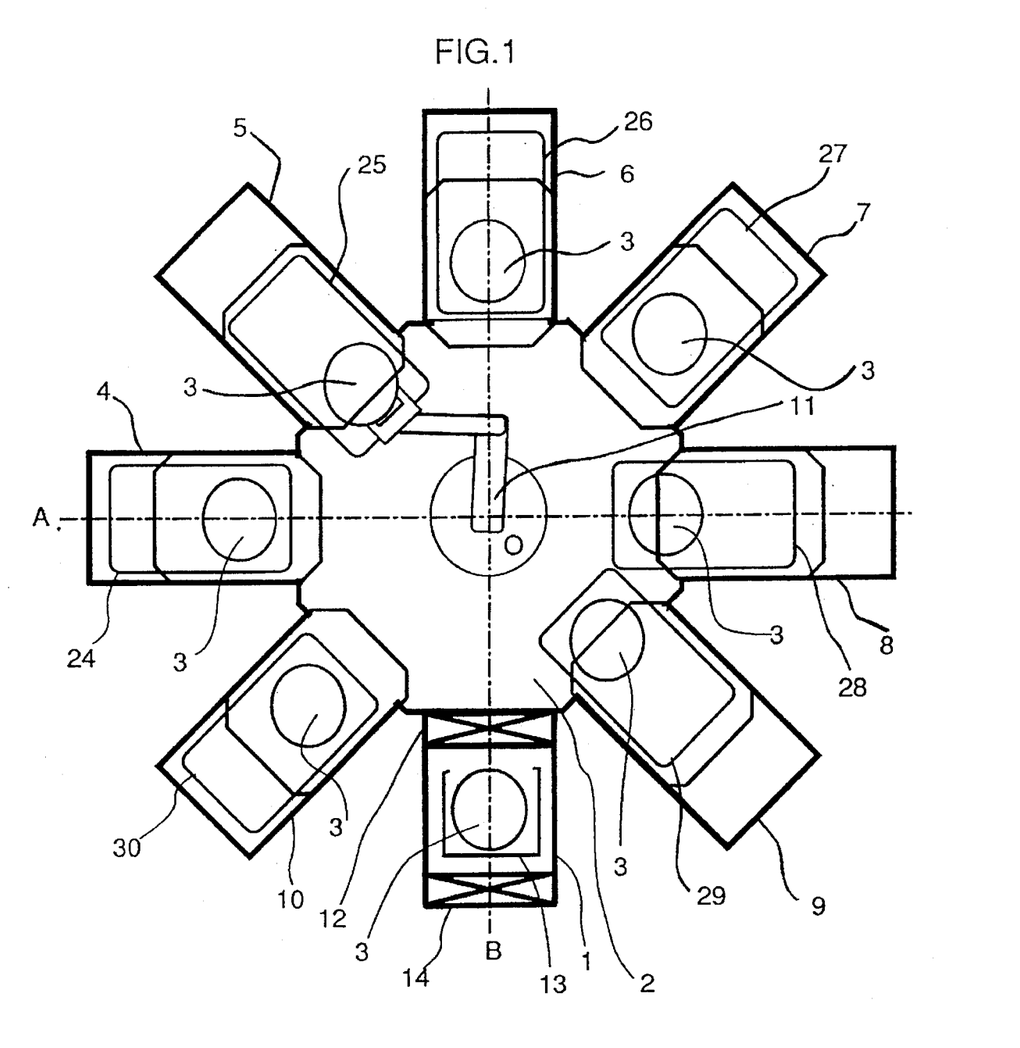
FIG. 1 is a schematic sectional plan view showing the basic construction of process equipment for a semiconductor device according to one embodiment of the present invention.
Figure 2:
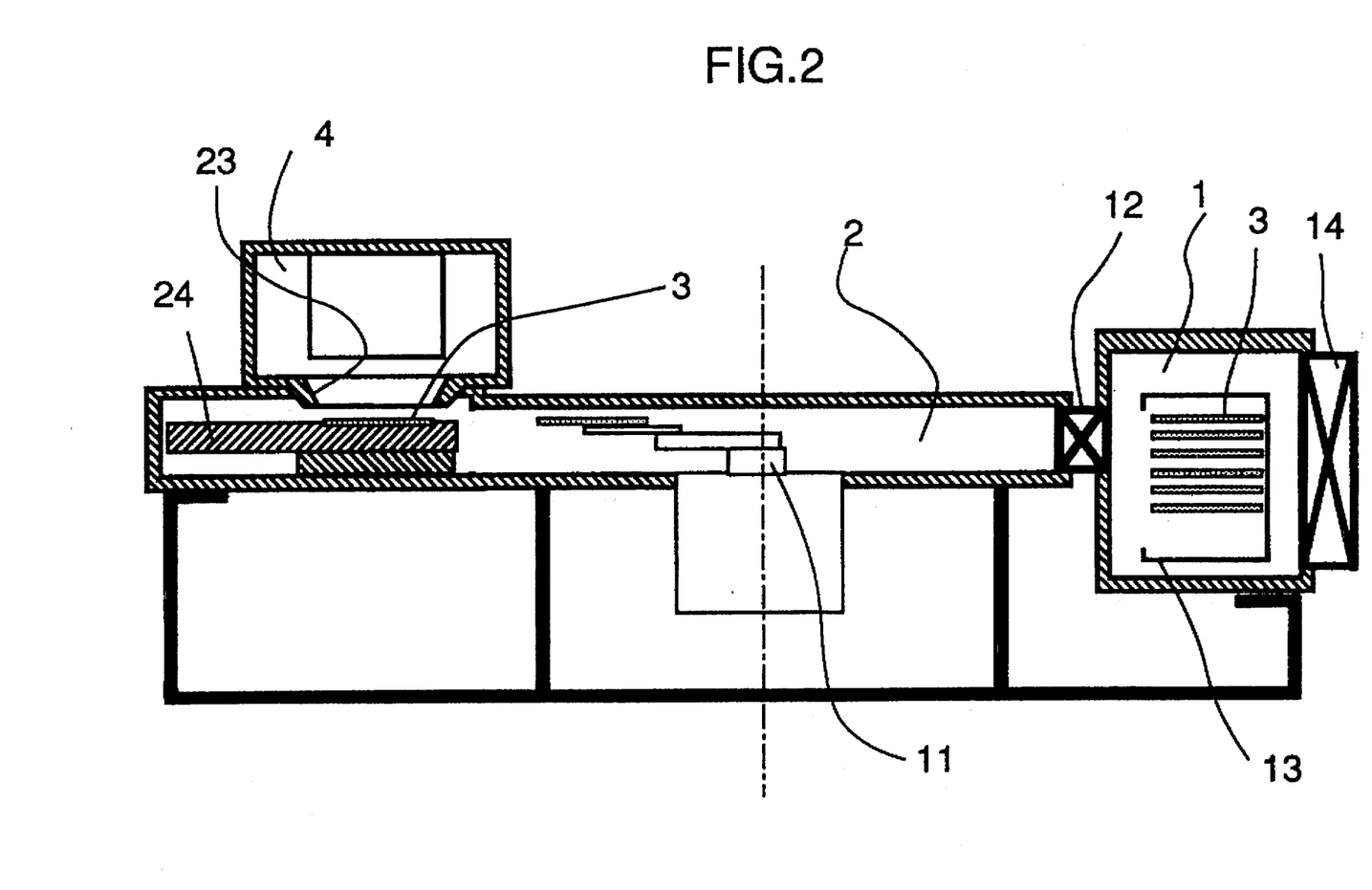
FIG. 2 is a schematic sectional side view of the equipment shown in FIG. 1.

FIGS. 1 and 2 show the basic construction of process equipment for a semiconductor device according to one embodiment of the present invention, wherein FIG. 1 is a schematic sectional view of the equipment as seen from the top and FIG. 2 is a schematic sectional view of the equipment taken along line A-0-B as seen from the side.

In the process equipment for a semiconductor device in this embodiment, a plurality of process chambers are connected to each other around a buffer chamber 2. The process chambers include a load-lock chamber 1 for transferring a wafer 3 to be processed between the exterior of the equipment and the buffer chamber 2; an etching chamber 4 for etching the wafer 3; a patterning chamber 5 for forming a pattern on the wafer 3; a thin film forming chamber 6 for forming a thin film on the wafer 3; a cleaning chamber 7 for cleaning the wafer a heat-treatment chamber 8 for heat-treating the wafer 3; a latent-image forming chamber 9 for forming a latent-image on the wafer 3; and a measuring chamber 10 for measuring the surface of the wafer 3. An opening means 23 is provided at the lower end portion of each process chamber, and each process chamber is communicated with the buffer chamber 2 by way of the opening means 23.

A carrying means 11 is provided within the buffer chamber 2 for transferring the wafer 3 between the buffer chamber 2 and the load-lock chamber 1, and for carrying the wafer 3 to a position facing to the opening means 23 of each process chamber. Each of holding/carrying means 24 to 30 is provided under the opening means 23 of each process chamber for carrying the wafer 3 received from the carrying means 11 to a specified process position and holding the wafer 3 at that position. A gate valve 12 is provided in a bulkhead between the load-lock chamber 1 and the buffer chamber 2, while a gate valve 14 is provided on a bulkhead between the load-lock chamber 1 and the exterior of the equipment (atmospheric pressure). A stocker 13 is provided in the load-lock chamber 1 for temporarily stocking the wafer 3.

The interior of the buffer chamber 2 is kept filled with a high purity inert gas (for example, nitrogen having a purity of 99.99% or more) atmosphere by an atmospheric gas control means (not shown). In transferring the wafers 3 between the load-lock chamber 1 and the exterior of the equipment, the gate valves 12, 14 are closed and the pressure of the load-lock chamber 1 is adjusted to be equal to the pressure (atmospheric pressure) of the exterior of the equipment, after which the gate valve 14 is opened and the wafers 3 are transferred therebetween. In transferring the wafers 3 between the load-lock chamber 1 and the buffer chamber 2, the gate valves 12, 14 are closed and the inert gas atmosphere and pressure of the load-lock chamber 1 are adjusted to be equal to those of the buffer chamber 1, after which the gate valve 12 is opened and the wafers 3 are transferred one by one therebetween using the carrying means 11 provided in the buffer chamber 2.

The interior of each of the process chambers 4 to 10 is kept in an atmospheric condition suitable for the process to be carried out therein.

Figure 3:
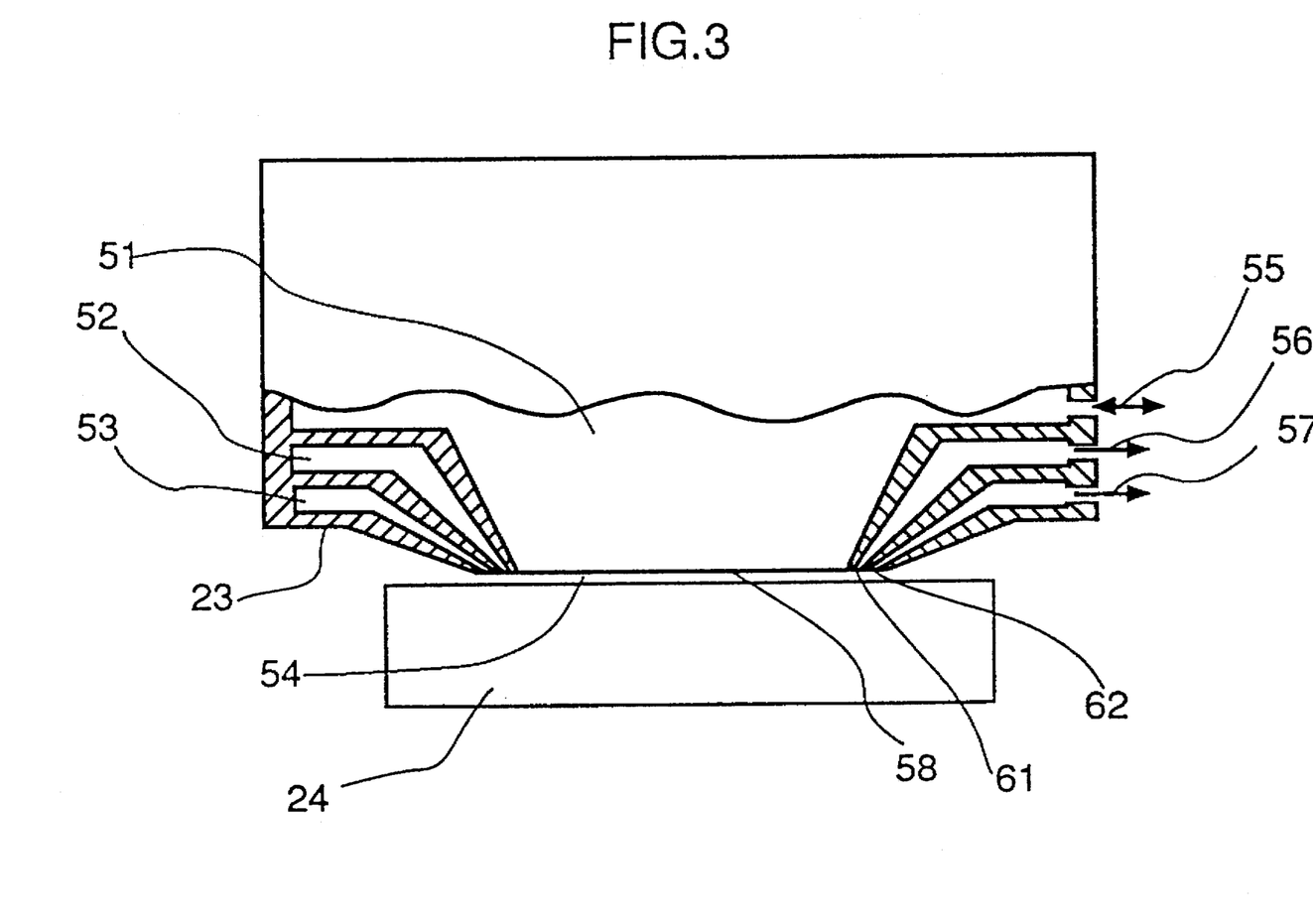
FIG. 3 is a schematic sectional view showing one construction example of an opening means of the equipment shown in FIG. 1.

The opening means 23 provided at the lower end of each process chamber is composed of a differential exhaust mechanism having a concentric structure, for example, shown in FIG. 3. The lower end opening surface of the opening means 23 is flattened. Each of the wafer holding/carrying means 24 to 30 is provided under the opening means 23 of each process chamber, and the upper surface thereof is also flattened. Each of the holding/carrying means 24 to 30 is adapted to hold on its upper surface the wafer 3 received from the carrying means 11, and to be radially movable around the buffer chamber 2 by a drive/guide means (not shown). Here, the gap between the upper surface of each of the holding/carrying means 24 to 30 and the lower end opening surface of the opening means 23 is kept small so that the lower end opening portion of the opening means 23 is closely blocked by the upper surface (or the upper surface of the wafer 3 held thereon) of each of the holding/carrying means 24 to 30, whereby an exhaust conductance between each of the process chambers 4 to 10 and the buffer chamber 2 can be kept small.

The carrying path along which the wafer 3 supplied from the stocker 13 in the load-lock chamber 1 into the buffer chamber 2 is subjected to a series of process steps in a plurality of process chambers and then returned to the stocker 13 in the load-lock chamber 1 again, is most suitably controlled by a control system (not shown) in accordance with the kinds and the order of the process steps to be applied to the wafer 3.

Each of the holding/carrying means 24 to 30 is provided with a wafer ascending/descending mechanism (not shown), and the wafer 3 is attached/detached onto the holding/carrying means by the above wafer ascending/descending mechanism and the carrying means 11. The upper surface of each of the holding/carrying, means 24 to 30, and the surface of the wafer 3 are kept to have respective degrees of flatness in the range of several ten µm or less. By previously controlling the gap between the upper surface flat portion of each of the holding/carrying means 24 to 30 and the lower end surface of the opening means 23 having the differential exhaust mechanism to be 100 µm or less, the atmosphere of each of the process chambers 4 to 10 is prevented from being mixed with the atmosphere of the buffer chamber 2 even when the wafer 3 held on the holding/carrying means is moved directly under the opening means 23 having the differential exhaust mechanism, thus independently and stably keeping the atmosphere of each process chamber.

A driving means (not shown) of each of the holding/carrying means 24 to 30 is separated from the inert gas atmosphere of the buffer chamber 2 by means of a flexible sealing means such as bellows.

The cleaning chamber 7 and the etching chamber 4 carry out process steps such as gas cleaning by fluorine based gas, dry cleaning using plasma gas, ashing cleaning by emission of a short wave length ray, and cleaning and etching by supply of chlorine gas and emission of a short wave length ray. In the above chambers 7 and 4, the process condition can be controlled by switching the process gas or using the process gas in combination with various exciting means, and various process steps can be carried out while the end point monitor for cleaning and etching is performed by measuring the condition of the surface of a wafer.

In the patterning chamber 5, a lithography step for forming a pattern on a wafer is carried out. As a pattern transferring means in this chamber, there may be used a method for transferring a mask pattern on a wafer in a reduction projection manner using a ultraviolet ray, and a method for directly forming a pattern on a wafer in a specified atmosphere using a charged particle beam and electron beam. In the pattern forming chamber 5, there can be also carried out process steps of emitting an energy beam such as a ultraviolet ray or electron beam in a pattern-like shape on a wafer while supplying a specified reactive gas on the wafer thereby depositing a pattern-like film on the wafer or etching the surface of a wafer and of diffusing specified atoms in a pattern-like shape within a wafer.

The film forming chamber 6 carries out a process step of depositing a film on a wafer having a mask made of a resist film or oxide film previously patterned thereon using a gas chemically vaporized in a plasma gas atmosphere.

The heat-treatment chamber 8 is used to apply a heat-treatment on a wafer; the latent-image forming chamber 9 is used to form a latent-image on the wafer and the measuring chamber 10 is used to measure the surface of the wafer 3.

In the above embodiment, the equipment including seven kinds of the process chambers has been shown however, it is technically easy that the equipment further includes the other well-known process functions necessary for processing a semiconductor device, and that the number of the process chambers is increased/decreased, as needed. In particular, by standardizing the structure of a connection portion between the buffer chamber and each process chamber, it is easier to increase/decrease the number of connectable process chambers and to exchange process chambers for maintenance. This is effective to reduce the equipment cost.

Figure 4:
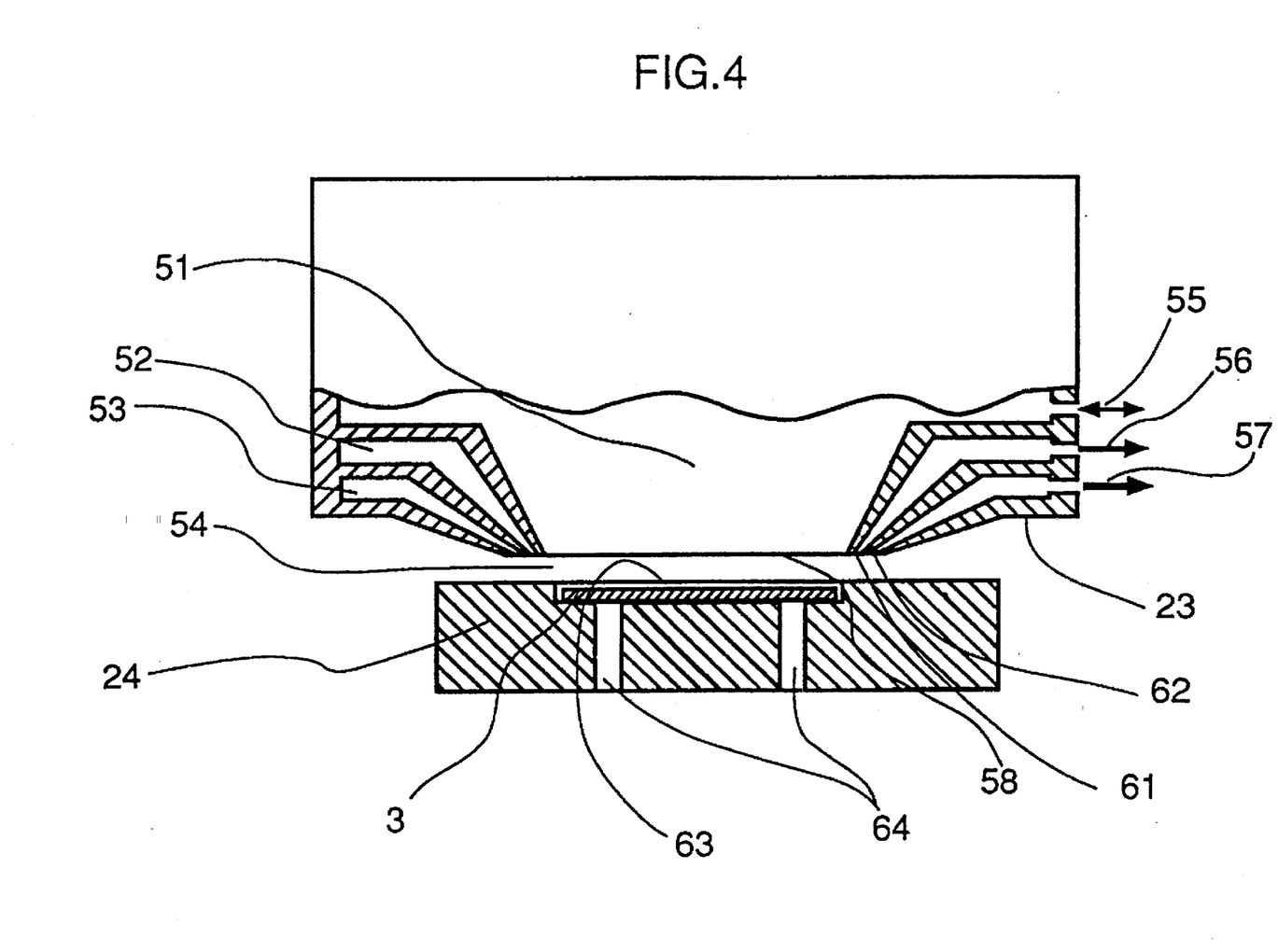
FIG. 4 is a schematic sectional view showing another construction example of the opening means in the equipment shown in FIG. 1.

FIGS. 3 and 4 show examples of the above-described opening means 23. Annular exhaust spaces 52, 53 for differential exhaust are provided to surround a circular opening portion 58 provided at the lower end of an internal space 51 of each process chamber. These exhaust spaces 52, 53 are independently connected to exhaust pumps (not shown) by way of exhaust holes 56, 57. The lower end portions of the exhaust spaces 52, 53 are concentrically opened around the circular opening portion 58, so that the differential exhaust is performed between the internal space 51 of each process chamber and the internal space of the buffer chamber 2. An atmosphere of the internal space 51 of each process chamber is controlled to be under a specified atmospheric condition by way of a supply/exhaust hole 55.

The lower end surfaces of the lower end opening portion 58 of the internal space 51 and the lower end opening portions 61, 62 of the exhaust spaces 52, 53 for differential exhaust are flattened, and they are disposed to be close and face to the upper surface flat portion of the wafer holding/carrying means 24, for example, by way of a small gap 54. By specifying the gap 54 to be 100μm or less, an exhaust conductance between the internal space 51 of each process chamber and the internal space of the buffer chamber 2 can be kept to be small. The respective atmospheric conditions of the internal space 51 of each process chamber and the internal space of the buffer chamber 2 can be thus independently and stably kept.

A recessed portion 63 for holding the wafer 3 is provided on the upper surface side of the holding/carrying means 24, and a plurality of vertical hole-like spaces 64 are provided on the bottom surface side of the recessed portion 63. An electrostatic chuck (not shown) for fixedly holding the wafer 3 is provided on the bottom surface of the recessed portion 63, and a wafer ascending/descending mechanism (not shown) for ascending/descending the wafer 3 is built in each of the vertical hole-like spaces 64.

In introducing the wafer 3 to a position under the opening portion 58 by the holding/carrying means 24, the holding/carrying means 20 is first moved toward the center of the buffer chamber 2 and is set at a position where the recessed portion 63 is out of the position under the opening means 23. Even in this state, since the upper surface flat portion of the holding/carrying means 24 is positioned so as to face to the lower end opening surface of the opening means 23 by way of the narrow gap, the atmospheric conditions of the internal space 51 of each process chamber and the internal space of the buffer chamber 2 can be independently kept. In such a state, the wafer 3 is carried to the position of the recessed portion 63 by the carrying means 11, and is received and drawn in the recessed portion 63 at a suitable position by ascending/descending the wafer 3 using the wafer ascending/descending mechanisms built in the vertical hole-like spaces 64, and is then fixedly held by the electrostatic chuck. Subsequently, by moving the holding/carrying means 24 outward, the wafer 3 held in the recessed portion 63 is positioned directly under the opening portion 58. In addition, according to the construction of the equipment, the surface of the wafer 3 held in the recessed portion 63 is equal in the level to or slightly lower than the upper surface flat portion of the holding/carrying means 24. As a result, even in the case where the holding/carrying means 24 is controlled to be moved in the lateral and longitudinal directions by a driving means (not shown), the wafer 3 can be held to be close to the lower side of the opening portion 58 while the distance between the upper surface flat portion of the holding/carrying means 24 and the lower end opening surface of the opening means 23 is kept constant. By vertically moving the holding/carrying means 24 using the driving means (not shown), the gap between the upper surface flat portion of the holding/carrying means 24 and the lower end opening surface of the opening means 23 can be controlled: accordingly, it is possible to suitably adjust the exhaust conductance between the internal space 51 of each process chamber and the internal space of the buffer chamber 2. On the other hand, by closely contacting the upper surface flat portion of the holding/carrying means 24 with the lower end of the lower end opening surface of the opening means 23 for substantially making zero the gap 54, it becomes possible to independently keep the atmospheric conditions of the internal space 51 of each process chamber and the internal space of the buffer chamber 2 even in the case where the differential exhaust operation is stopped.

<Embodiment 2>

Figure 5:
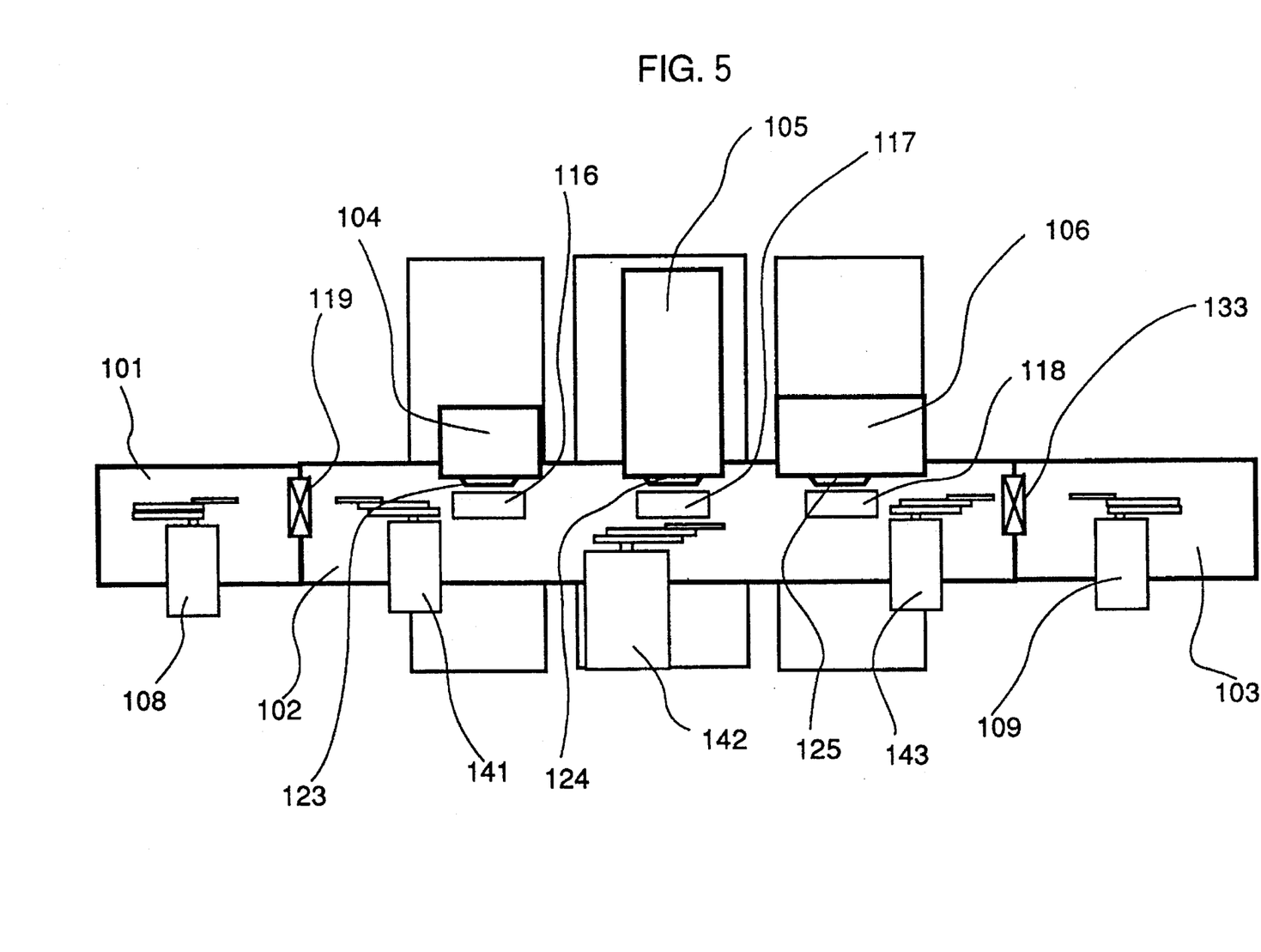
FIG. 5 is a schematic sectional side view showing the basic construction of process equipment for a semiconductor device according to another embodiment of the present invention.
Figure 6:
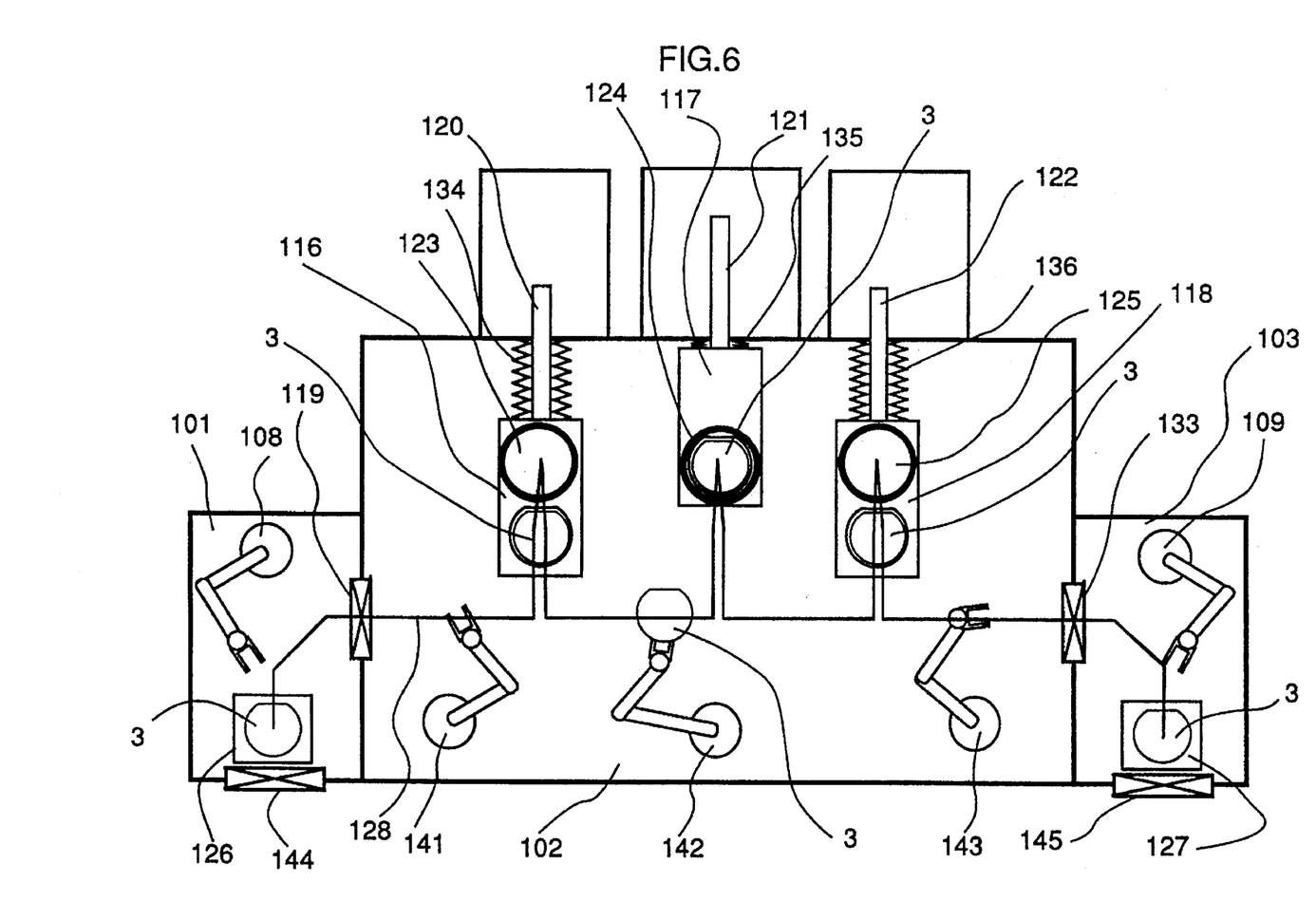
FIG. 6 is a schematic sectional plan view of the equipment shown in FIG. 5.

FIGS. 5 and 6 show a schematic construction of process equipment for a semiconductor device according to a second embodiment of the present invention, wherein FIG. 5 is a schematic sectional view of the equipment as seen from the side: and FIG. 6 is a schematic sectional view of the equipment as seen from the top.

The process equipment for a semiconductor device, in this embodiment includes a loading chamber 101 for feeding a wafer 3 from the exterior of the equipment a plurality of process chambers such as a cleaning/etching chamber 104, a patterning chamber 105, and a film forming chamber 106; a buffer chamber 102 including carrying means 141, 142, 143 for carrying the wafer 3 to holding/carrying means (sample stages) 116, 117, 118 corresponding to the respective process chambers; and an unloading chamber 103 for taking out the wafer 3 which is already finished in a series of process steps to the exterior of the equipment.

On a bulkhead between the buffer chamber 102 and the loading chamber 101 and a bulkhead between the buffer chamber 102 and the unloading chamber 103, gate valves 119, 133 are respectively provided for allowing the wafer 3 to pass through the bulkheads. On a bulkhead between the loading chamber 101 and the exterior of the equipment and a bulkhead between the unloading chamber 103 and the exterior of the equipment, gate valves 144, 145 are respectively provided for allowing the wafer 3 to pass through the bulkheads.

Stockers 126, 127 for temporarily stocking the wafer 3 are respectively provided in the loading chamber 101 and the unloading chamber 103. A carrying means 108 for carrying the wafer 3 from the stocker 126 into the buffer chamber 102 by way of the gate valve 119 is provided in the loading chamber 101. A carrying means 109 for carrying the wafer 3 from the buffer chamber 102 into the stocker 127 by way of the gate valve 133 is provided in the unloading chamber 3. The buffer chamber 102 is filled with a high purity inert gas, for example nitrogen gas having a purity of 99.99% or more. The nitrogen gas atmosphere is controlled by an atmospheric gas control means (not shown) by way of a gas supply tube and a gas exhaust tube.

In feeding the wafers 3 from the exterior of the equipment into the loading chamber 101, the gate valves 119, 144 are closed and the pressure of the loading chamber 101 is adjusted to be equal to the pressure (atmospheric pressure) of the exterior of the equipment. After that, the gate valve 144 is opened, and the wafers 3 are fed from the exterior of the equipment into the stocker 126 and are contained therein. After the feedin of the wafers 3, the gate valve 144 is closed again, and the inert gas atmosphere and pressure of the loading chamber 101 are adjusted to be equal to those of the buffer chamber 102.

In carrying the wafers 3 from the loading chamber 101 into the buffer chamber 102, the inert gas atmosphere and pressure of the loading chamber 101 are adjusted to be equal to those of the buffer chamber 102, and the gate valve 119 is opened, after which the wafers 3 are carried one by one from the stocker 126 into the buffer chamber 102 using the carrying means 108.

In carrying the wafers 3, which are already subjected to a specified process within the buffer chamber 102, from the buffer chamber 102 into the unloading chamber 103, the inert gas atmosphere and pressure of the unloading chamber 103 are adjusted to be equal to those of the buffer chamber 102, and the gate valve 133 is opened, after which the wafers 3 are carried one by one from the buffer chamber 102 into the stocker 127 using the carrying means 109.

In taking out the wafers 3 from the unloading chamber 103 to the exterior of the equipment, the gate valves 133, 145 are closed and the pressure of the unloading chamber 103 is adjusted to be equal to the pressure (atmospheric pressure) of the exterior of the equipment, after which the gate valve 145 is opened and the wafers 3 contained in the stocker 127 are taken out to the exterior of the equipment.

After the take-out of the wafers 3, the gate valve 145 is closed again, and. the inert gas atmosphere and pressure of the unloading chamber 103 are adjusted to be equal to those of the buffer chamber 102.

Opening means 123, 124, 125 including concentric differential exhaust mechanisms being the same as those in FIGS. 3 and 4 are respectively provided at the lower end portions of the cleaning/etching chamber 104, patterning chamber 105 and the film forming chamber 106, and each process chamber is communicated with the internal space of the buffer chamber 102 by way of the opening means thereof. The lower end opening surface of each opening means is flattened. Holding/carrying means 116, 117, 118 for holding/carrying a wafer 3 are provided under the opening means 123, 124, 125, respectively. The upper surface of each of the holding/carrying means is also flattened. The flat upper surface of the holding/carrying means is disposed to be close and face to the lower end surface of the corresponding opening means for making small the gap between the facing surfaces, so that an exhaust conductance between each process chamber and the buffer chamber 2 can be kept to be small.

The transfer of the wafer 3 onto the holding/carrying means 116, 117, 118 is performed using carrying means 141, 142, 143, respectively, in the same manner as in Embodiment 1. The surface of the wafer 3 and the upper surface flat portions of the holding/carrying means 116, 117, 118 are kept to have respective degrees of flatness in the range of several ten µm or less. By previously setting the gap between the upper surface flat portion of each of the holding/carrying means 116, 117, 118 and the lower end opening surface of each of the opening means 123, 124, 125 to be 100 µm or less, the atmosphere of each of the process chambers 104, 105, 106 is prevented from being mixed with the atmosphere of the buffer chamber 102 even when each of the holding/carrying means 116, 117, 118 mounting the wafer 3 is moved in the lateral and longitudinal directions. This makes it possible to independently hold the atmospheric condition of each process chamber, and to keep clean the atmosphere of the buffer chamber 102.

According to the construction of this equipment, each of the holding/carrying means 116, 117, 118 holds the wafer 3 supplied from each of the carrying means 141, 142, 143 on the surface thereof and can be moved in the three-dimensional directions by each of the driving means 120, 121, 122. The driving means 120, 121, 122 are sealed by flexible sealing means 134, 135, 136 such as bellows, to be thus separated from the atmosphere of the buffer chamber 102.

The line 128 shows one example of a path along which the wafer 3 carried in the stocker 126 within the loading chamber 101 is subjected to specified process steps in a plurality of the process chambers and then fed in the stocker 127 within the unloading chamber 103. The wafer 3 taken out of the stocker 126 by the carrying means 108 is fed in the buffer chamber 102 through the gate valve 119, and is then supplied to the carrying means 141 and further to the carrying means 142, 143. Namely, the wafer 3 can be carried within the buffer chamber 102 in a bucket relay system using the carrying means 141, 142, 143, so that the carrying freedom of the wafer 3 within the buffer chamber 102 can be enhanced.

The cleaning/etching chamber 104 carries out process steps such as gas cleaning by fluorine based gas, dry cleaning using plasma gas, ashing cleaning by emission of a short wave length ray, and cleaning and etching by supply of chlorine gas and emission of short wave length ray. In the above chamber 104, the process condition can be controlled by switching the process gas or using the process gas in combination with various exciting means, and the process steps can be carried out while the end point monitor for cleaning and etching is performed by measuring the condition of the surface of a wafer.

In the patterning chamber 105, a lithography step for forming a pattern on a wafer is carried out. As a pattern transferring means, there may be used a method for transferring a mask pattern on a wafer in a reduction projection manner using a ultraviolet ray, and a method for directly forming a pattern on a wafer in a specified atmosphere using a charged particle beam or electron beam. In this chamber, there can be also carried out process steps of emitting an energy beam such as a ultraviolet ray or electron beam in a patternlike shape on a wafer while supplying a specified reactive gas on the wafer thereby depositing a film in the pattern-like shape on the wafer or etching the surface of a wafer in a pattern-like shape; and of diffusing specified atoms in a pattern-like shape within a wafer.

The film forming chamber 106 carries out a process step of depositing a film on a wafer by supplying a gas chemically vaporized in a plasma gas atmosphere to the wafer by way of a mask made of a resist film or oxide. film previously patterned thereon.

As described above, according to the present invention, since a wafer is carried to a position facing to each of a plurality of process chambers within a buffer chamber filled with a high purity inert gas atmosphere, it is possible to prevent the wafer from being unnecessarily oxidized and contaminated. Since each process chamber is communicated with the buffer chamber by way of an opening means having a differential exhaust mechanism provided in each process chamber, as compared with the case where a gate valve is provided between each process chamber and the buffer chamber, there is not required a time for exhaust and pressure setting upon opening/closing of the gate valve. Since the wafer is freely moved and positioned against each process chamber by a wafer holding/carrying means, only the desirable portion of the wafer can be selectively processed. Since a plurality of steps are sequentially and thoroughly carried out within the buffer chamber, high quality semiconductor devices can be produced at a high throughput only by one set of equipment, resulting in the reduced processing cost.

According to the equipment of the present invention, since a wafer is sequentially carried from, one carrying means to the next carrying means or from one carrying means to an arbitrary carrying means, the freedom of the carrying route can be enhanced. Consequently, it becomes possible to early build up the wafer carrying system and reduce the cost upon the change in the layout of a plurality of process chambers and upon the maintenance of the equipment, and to prevent the blowing phenomenon of dust. Moreover, since a series of process steps necessary for processing semiconductor devices are thoroughly completed within the buffer chamber kept in a high purity inert gas atmosphere, an additional environment such as a high clean room is not particularly required, thereby reducing the cost of the process equipment for a semiconductor device.

It is further understood by those skilled in the art that the foregoing description is a preferred embodiment of the disclosed device and that various changes and modifications may be made in the invention without departing from the spirit and scope thereof.

What is claimed is:

1. Process equipment for processing a semiconductor device comprising:
    a buffer chamber;
    at least one process chamber connected to said buffer chamber through an opening portion;
    a holding/carrying means disposed in said buffer chamber at a position facing said opening portion for holding and carrying a member to be processed, said holding/carrying means including a flattened surface closely facing said opening portion; and
    carrying means disposed in said buffer chamber for transferring said member to be processed to and from said holding/carrying means.

2. Process equipment according to claim 1, wherein said opening portion has a flattened surface closely facing said flattened surface of said holding/carrying means.

3. Process equipment according to claim 1, wherein said holding/carrying means including said flattened surface closely facing said opening portion enables holding of an atmosphere in said at least one process chamber independently from an atmosphere in said buffer chamber.

4. Process equipment according to claim 1, wherein the atmosphere in said buffer chamber is an inert gas atmosphere.

5. Process equipment according to claim 1, wherein a plurality of process chambers are provided and are respectively connected to said buffer chamber through a respective opening portion, and further comprising a plurality of differential exhaust mechanisms respectively provided around respective opening portions for differentially exhausting associated ones of said plurality of process chambers and said buffer chamber, a plurality of holding/carrying means being provided and respectively disposed in said buffer chamber at a position closely facing each of said opening portions and each of said differential exhaust mechanisms for holding and carrying the member to be processed, said carrying means being disposed in said buffer chamber for transferring the member to be processed to and from each of said holding/carrying means, each of said holding/carrying means having the flattened surface positioned closely facing each of said opening portions and each of said differential exhaust mechanisms.

6. Process equipment according to claim 5, wherein each of said opening portions has a flattened surface closely facing said flattened surface of a respective one of said holding/carrying means.

7. Process equipment according to claim 5, further comprising means for filling the interior of said buffer chamber with an inert gas atmosphere.

8. Process equipment according to claim 5, wherein at least one of said plurality of process chambers forms a pattern on the member to be processed by a charged particle beam.

9. Process equipment according to claim 5, wherein at least one of said plurality of process chambers includes means for supplying a gas in said one process chamber and means for exhausting the gas in said one process chamber.

10. Process equipment according to claim 5, wherein at least one of said plurality of process chambers includes means for exciting a gas and supplying excited gas to the member to be processed.

11. Process equipment according to claim 5, wherein at least one of said plurality of process chambers includes means for etching a surface of the member to be processed.

12. Process equipment according to claim 5, wherein at least one of said plurality of process chambers includes means for forming a film on a surface of the member to be processed.

13. Process equipment according to claim 1, wherein the member to be processed is a wafer.

14. A method of processing a semiconductor device comprising the steps of:

transferring a member to be processed onto a holding/carrying means provided in a buffer chamber;

positioning said holding/carrying means to closely face an opening portion provided between at least one process chamber and said buffer chamber;

differentially exhausting said at least one process chamber and said buffer chamber so as to independently hold an atmosphere in said at least one process chamber and an atmosphere in said buffer chamber; and exposing the member to be processed to the atmosphere in said process chamber through said opening portion for processing the member to be processed.

15. A method according to claim 14, wherein said holding/carrying means has a flattened surface positioned closely facing said opening portion.

16. A method according to claim 15, wherein said opening portion has a flattened surface closely facing said flattened surface of said holding/carrying means.

17. A method according to claim 14, wherein an interior of said buffer chamber is filled with an inert gas atmosphere.

* * * * *